United States Patent [19]
Guo

[11] Patent Number: 6,061,759
[45] Date of Patent: May 9, 2000

[54] HIDDEN PRECHARGE PSEUDO CACHE DRAM

[75] Inventor: Ta-Pen Guo, Cupertino, Calif.

[73] Assignee: Apex Semiconductor, Inc., Cupertino, Calif.

[21] Appl. No.: 08/599,075

[22] Filed: Feb. 9, 1996

[51] Int. Cl.[7] .................................................... G06F 13/00
[52] U.S. Cl. .......................... 711/105; 711/101; 711/104; 711/5; 711/167; 711/168
[58] Field of Search .................................... 395/410, 412, 395/404, 484, 413; 365/203, 149, 189.08, 230.06, 189.05; 711/5, 101, 105, 168, 167, 104

[56] References Cited

U.S. PATENT DOCUMENTS

| | | | |
|---|---|---|---|
| 4,613,958 | 9/1986 | Culican et al. | 365/189.08 |
| 4,924,375 | 5/1990 | Fung et al. | 395/484 |
| 4,943,944 | 7/1990 | Sakui et al. | 365/189.05 |
| 5,220,527 | 6/1993 | Ohsawa | 365/149 |
| 5,265,236 | 11/1993 | Mehring et al. | 395/413 |
| 5,297,091 | 3/1994 | Blake et al. | 365/203 |
| 5,307,469 | 4/1994 | Mann | 395/405 |
| 5,522,064 | 5/1996 | Aldereguia et al. | 395/550 |
| 5,546,350 | 8/1996 | Gillingham | 365/230.06 |

Primary Examiner—Eddie P. Chan
Assistant Examiner—T. V. Nguyen

[57] ABSTRACT

A new DRAM architecture, HPPC DRAM, is provided to support a high performance and low cost memory system. The HPPC DRAM has integrated the following concepts into a single DRAM chip. First, superset pin definitions backward-compatible to the traditional fast-page-mode DRAM SIMM. This allows one memory controller to support a memory system having both a traditional fast-page-mode DRAM and HPPC DRAM of this invention. Secondly, combining a memory array, a register of 4:1 Mux/Demux function, a RAS buffer/decoder, a CAS buffer/decoder, a burst address counter, a page register/comparator, a sequencer and a data buffer into a single DRAM IC chip. Using these intelligent peripheral circuits, the HPPC DRAM execute a pipeline cycle request and precharge cycle stealing. Thirdly, a precharge cycle stealing pipeline is implemented to the timing chain of read operation to eliminate the precharge cycle time which is achieved by executing read drive concurrently to the precharge cycle. This read timing chain shows that a zero wait state is sustained if there is a page-hit. Fourthly, a precharge cycle stealing pipeline is implemented to the timing chain of write operation to eliminate the precharge cycle time which is achieved by executing precharge cycle concurrently to address predecoding and data strobing.

32 Claims, 5 Drawing Sheets

HIDDEN PRECHARGE PSEUDO CACHE DRAM

TECHNICAL FIELD OF INVENTION

The invention relates to Dynamic Random Access Memory (DRAM) and, in particular, to DRAM with characteristics of hidden precharge.

TECHNICAL BACKGROUND OF INVENTION

In recent years, the home PC has the highest growth rate in the PC market. The home PC provides not only the personal productivity enhancement but also communication, entertainment and education. The technology of the home PC becomes more complicated than the traditional business PC, which provides only the office productivity. Facing the introduction of 32-bit Windows 95 operating system, the design of home PC is no longer a trivial job to most computer designers. Take an example of the following challenge: home PC needs not only a very low cost structure to be mass manufactured but also a very high performance to run various applications. The key components of PC are consisted of four parts, namely CPU, memory, system core logic and peripheral subsystem. CPU is currently dominated by Intel Corp., and most of the computer system designers do not have much freedom to exploit in this area. The industry standard PCI bus has improved the I/O devices to a new high performance level. It will not change to a new bus within a foreseeable near future. The only part left to the computer designer is the memory subsystem. These include both the memory controller inside the system logic and DRAM itself.

Conventional wisdom on the memory subsystem is that the system core logic needs to support a very advanced cache memory architecture to fully exploit the CPU performance. The approach usually becomes prohibited in the home PC because of the high cost of cache Static Random Access Memory (SRAM). If one is requested to implement a low cost home PC, the cache memory feature will be omitted in the first place. But the cacheless system may cost the performance degradation from 20% up to 50%. The new DRAM technology like Extended Data Out(EDO) DRAM can only improve performance by less than 5%. Even Burst-EDO(BEDO), Synchronous DRAM or RAMBUS DRAM can only improve performance by less than 10%. Further details of the BEDO DRAM may be referred in MICRON CO.'s data sheet regarding to MT4LC2M8F4 product. Further details of the Synchronous DRAM may be referred in NEC CO.'s data sheet regarding to PD4516421, PD4516821 or PD4516161 product. None of current DRAM technologies can really solve the problem of performance degradation when cache memory is not implemented within the system. The reason for the minor improvement with those new DRAM technologies is due to the fact of bad memory locality in the behavior of 32-bit operating system. The bad memory locality causes a huge overhead both to the cache-miss rate and DRAM page-miss rate. In system with BEDO DRAM, synchronous DRAM or RAMBUS DRAM, condition of page-miss interrupts burst-type transfer frequently. One alternative is to use a multi-bank DRAM architecture with page interleave scheme to improve the page-hit rate. Such scheme may be totally understood by referring U.S. Pat. No. 4,924,375. But this approach will yield a bigger die size due to inefficient overhead of its peripheral circuits. As a result, the cost of current new type DRAMs, which are implemented intentionally to replace the cache SRAM in the computer system, may easily exceeds the cost of cache SRAM. Therefore, low cost and, at the same time, high performance is simply not available from the conventional wisdom up to date.

In order to yield a high performance comparable to a typical cache SRAM system, two basic goals: 1) no memory page-miss overhead and 2) high data burst rate, must be met. Based on the above recitations, the inventor of the instant invention invents a new DRAM architecture which delivers both a low cost implementation and a high performance comparable to the cache SRAM. With this invention, two basic requirements are still met: 1) backward-compatible to the current fast page mode DRAM single in-line memory module (SIMM) and 2) similar single bank architecture of the current fast page mode DRAM in order to leverage the current lowest cost infrastructure from the fast page mode DRAM. In this new DRAM of the invention, no cache TAG SRAM is used, since both TAG comparison and its associated costs are extra overhead to the memory subsystem. Further details of the fast page mode DRAM may be referred in U.S. Pat. No. 5,265,236 or MICRON CO.'s data sheet regarding to MT4LC4M4A1/B1(S) product.

As recited hereinafter, a hidden precharge pseudo cache (HPPC) DRAM is disclosed to meet all above design requirements or goals. This new technology of HPPC DRAM brings a new level of high performance to all low cost PCs. The pin definitions of HPPC DRAM is comparable to the state-of-art fast page mode DRAM to allow constructing a backward-compatible DRAM SIMM. Further details of the pin layout of the fast page mode DRAM may be referred in MICRON CO.'s data sheet regarding to MT4LC4M4A1/B1(S) product. Further details of the fast page mode DRAM SIMM module may be referred in MICRON CO.'s data sheet regarding to MT8LD132(S) or MT16LD232(S) product.

SUMMARY OF THE INVENTION

The HPPC DRAM has a superset of pin function descriptions. A packet command cycle is used to instruct the DRAM to execute one of the following seven active DRAM cycles: burst read, single read, memory refresh, burst write, single write, register write and register read. HPPC DRAM uses a pseudo clock, CAS#, to control the operation of an internal sequencer.

In one preferred embodiment, a DRAM device including memory cell array, a page register/comparator, and state machine device is provided. The state machine device executes read drive of an on-going memory cycle concurrently to a precharge operation of a pending memory cycle by outputting a first control signal and a second control signal to the register and memory cell array respectively.

In another preferred embodiment, a single integrated circuit DRAM device is provided. The DRAM device includes memory cell array and a state machine. The state machine outputs a plurality of timing signals to control the series of operation.

DETAILED DESCRIPTIONS OF THE PREFERRED EMBODIMENT

Figure 1:
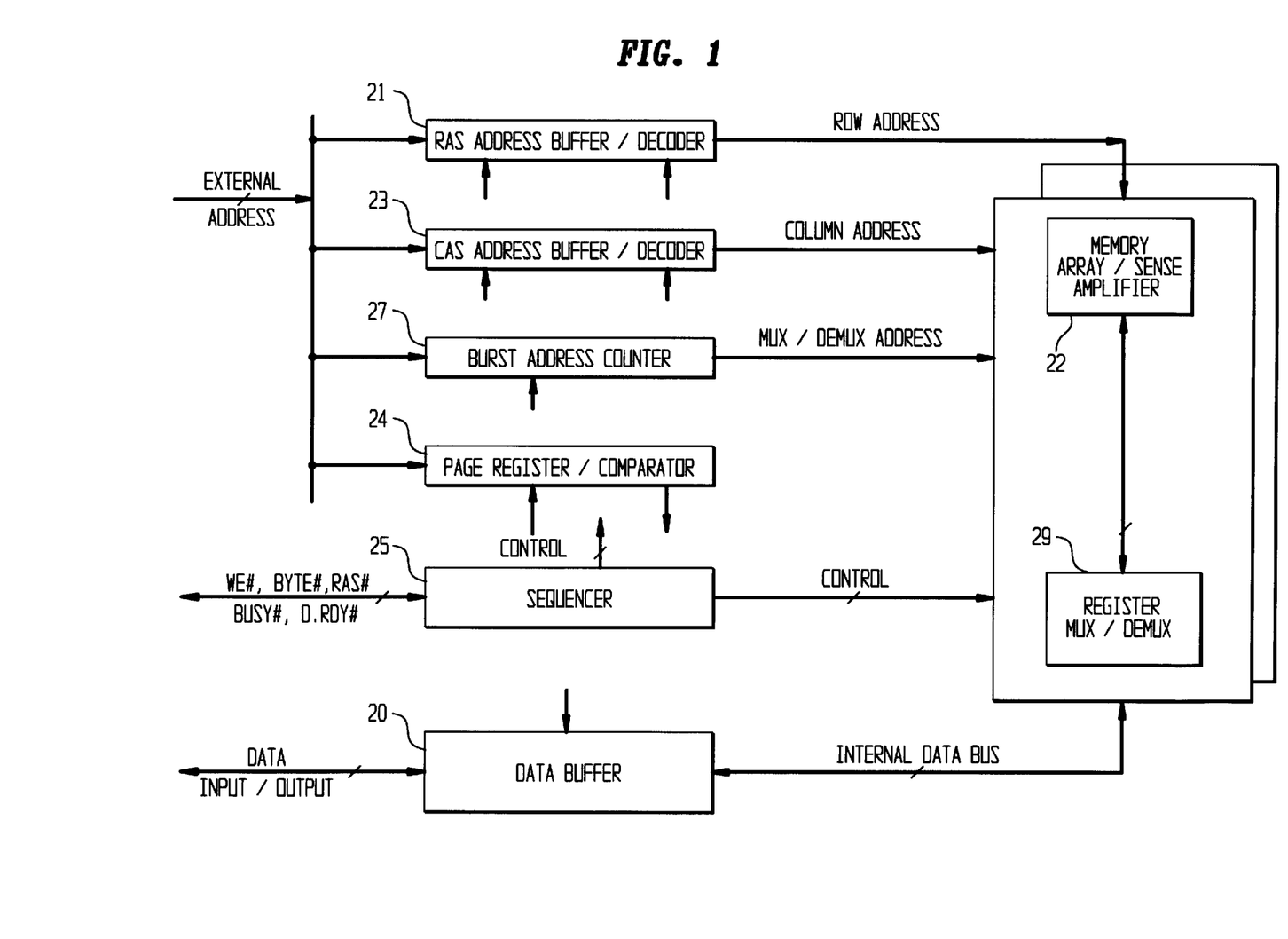
FIG. 1 shows a HPPC DRAM architecture of the invention.

A HPPC DRAM architecture of the invention is shown in FIG. 1. It contains one row address buffer/decoder 21 (RAS buffer/decoder) and one column address buffer/decoder 23 (CAS buffer/decoder).

Both RAS buffer/decoder 21 and CAS buffer/decoder 23 simultaneously decode the address for both pending cycle and on-going cycle. Thus it allows the external memory controller (not shown) to achieve high performance pipeline access. As hereinafter recited, an internal sequencer 25 controls the timing of operation of the two address buffers/decoders and other circuits to achieve a pipeline timing chain. In such arrangement, the critical timing path of DRAM access time can be partitioned and the sequencer 25 performs memory burst cycle pipeline operation.

The HPPC DRAM includes a burst address counter 27 which is a loadable counter. Whenever the sequencer 25 loads a new column address to CAS buffer/decoder 23, A1 and A0 bits of the address value is loaded to the burst address counter 27 as the initial column address value of the burst cycle. The burst address counter 27 performs either well-known interleave burst or linear burst, which depends on the mode setting of an internal register not shown in FIG. 1, starting from the initial column address value. Burst address drives directly to a register 29 of 4-to-1 multiplexer/demultiplexer function. The register 29 connects to the memory array 22 via four signal lines on the one hand and, on the other hand, connects to a data buffer 20 via one internal data bus. During the read cycle, the register 29 multiplexes 4 bits data into 1 bit data-stream to the data buffer 20 under the selection of the burst address signal from burst address counter 27. During the write cycle, the register 29 demultiplexes 1 bit data stream from the data buffer 20 into 4 bits data which are carried by the four signal lines. The sequencer 25 determines when to increment address and how to increment the address by outputting control signals to burst address counter 27.

The memory array cycle starts when the sequencer 25 asserts the address enabling signal (ROW_EN) within the control signal lines. One row of the memory array 22 shifts data to the sense amplifiers within the memory cell array. The CAS buffer/decoder 23 asserts A9–A2 and four sense amplifiers will be selected. When the sequencer 25 asserts the read enable signal (COLUMN_EN) within the control signal lines, the selected four sense amplifiers shift 4 bits data to the register 29. In case of a write cycle, the asserted COLUMN_EN signal forces the selected data being written from the register 29 to the four sense amplifiers within the memory cell array. In other words, the memory array 22 is configured as four bits access in the shown embodiment. The timing path of the conventional DRAM is partitioned into two parts by this invention: one from memory array 22 to register 29, and other from register 29 to the I/O pad of the DRAM chip.

The page register/comparator 24 is provided to hold the current row address. Whenever the sequencer 25 asserts the address enabling signal (ROW_EN), the row address will simultaneously be loaded into the page register/comparator 24. The page register/comparator 24 compares the row address of a pending cycle with the current row address. The sequencer 25 uses the page-comparison result from the page register/comparator 24 to decide whether to perform a precharge cycle stealing during the memory cycles. The page-comparison result is ignored if the sequencer's internal state is idle or there is no pending memory-access-request.

The data buffer 20 performs not only input and output driver but also a temporary register for the memory access pipeline operation. The timing for strobing input data or drive output data is controlled by the output control signals of the sequencer 25. The timing control by the sequencer 25 regulates the DRAM entire memory access pipeline operation.

As aforesaid, the HPPC DRAM includes a sequencer 25 which is a state machine clocked by the external CAS#. In order to save the pin numbers, two external signals RAS# and WE# are used to form a command packet for executing one of seven active HPPC DRAM cycles which include Single Read, Burst Read, Memory Refresh, Single Write, Burst Write, Register Write and Register Read. One preferred embodiment of the cycle decode through command packet scheme is shown in the context of the WE# description of the attached table below. The sequencer 25 decodes the command packet to determine the type of DRAM cycle. The command packet methodology is quite well known in the area of data communication. Once the cycle is started, a timing chain is generated to control the RAS buffer/decoder 21, the CAS buffer/decoder 23, the burst address counter 27, the page register/comparator 24, the data buffer 20, the register 29 and memory array 22. The sequencer 25 feedbacks two protocols, BUSY# and D_RDY#, to the DRAM controller. BUSY# is used to instruct that, whether the sequencer 25 is ready to execute the pipeline request if there is any pending cycle. D_RDY# is used to instruct the data read is ready for external memory controller to strobe. In a preferred embodiment, both BUSY# and D_RDY# are wired-OR driver output.

In particular, the internal sequencer 25 performs the following functions to control the cycle pipeline operation: (1) when to start a row access to the memory array, (2) when to start a column access to the memory array, (3) when to do the memory precharge, (4) when to latch the external row address value, (5) when to latch the external column address value, (6) when to load and increment the burst address counter to register 29.

The sequencer 25 uses a set of control signals to perform the above function by controlling the elements in FIG. 1.

(1) ROW_EN signal

ROW_EN is the signal to control the row access and precharge of the memory array 22. When ROW_EN is asserted as low, the memory array 29 is precharged. When ROW_EN is asserted as high, the row access of the memory array starts.

(2) COLUMN_EN signal

COLUMN_EN enables the bit line sense amplifier for reading or writing register 29. When COLUMN_EN is high, the pass gate of bit line sense amplifier will open for column read or write. When COLUMN_EN is low, the pass gate of bit line sense amplifier will be closed.

(3) RA_LATCH_V signal

RA_LATCH_V is the signal to latch the external address to row address buffer/decoder 21. When RA_LATCH_V signal is high, the external address will flow to the row address buffer/decoder 21. The sequencer 25 latches the row address buffer/decoder 21 until there is a new external address.

(4) CA_LATCH_V signal

CA_LATCH_V is the signal to latch the external address to column address buffer/decoder 23. When CA_LATCH_V signal is high, the external address will flow to the column address buffer/decoder 23. The sequencer 25 latches the column address buffer/decoder 23 until there is a new external address.

(5) LOAD_EXT signal

LOAD_EXT is the signal to load the burst address counter 27 from CAS address buffer 23. When LOAD_EXT is asserted high by the sequencer 25, the burst address counter 27 will load the lowest two bits from the CAS address buffer 23.

(6) INC_ADR signal

INC_ADR is the signal to increment the burst address counter 27. The sequencer 25 will increment the burst address counter 27 when there is a burst cycle. The address output from burst address counter 27 will then be incremented.

(7) RA_EN signal

RA_EN is another control signal to the row address buffer/decoder 21 which triggers the output the address value in the row address buffer/decoder 21 to the row address line. When RA_EN signal is high, the address value will flow to the row address line. It is the row location of the address value on the row address line, rather than the value within the row address buffer/decoder 21, the on-going memory cell array is being accessed.

(8) CA_EN signal

CA_EN is another control signal to the column address buffer/decoder 23 which triggers the output the address value in the column address buffer/decoder 23 to the column address line. When CA_EN signal is high, the address value will flow to the column address line. It is the column location of the address value on the column address line, rather than the value within the column address buffer/decoder 23, the on-going memory cell array is being accessed.

It is to be noted, to person skilled in the arts, the functions of the aforesaid signals may still be achieved by replacing the asserted logic low or high state by an asserted high or low state, and vice versa. Those modifications and substitutions are still within the spirits of the invention.

One of the most innovative feature of the HPPC DRAM is a high sustain bandwidth which is comparable to the current expensive cache SRAM. The high sustain bandwidth is achieved by using a pipeline partition and precharge cycle stealing. In general, a DRAM cycle is consisted of an active period and a precharge period. In order to improve the bandwidth, conventionally, one always uses a page mode to avoid the precharge period overhead. But it was pointed out earlier that the modern operating system does not have a good memory locality. The page-miss rate is so high that the precharge period becomes a major overhead which results in a low sustain bandwidth even when the burst data rate per se is high. A pipeline operation of the invention can be achieved based on the timing chain partition which is disclosed in FIG. 2.

Figure 2A:
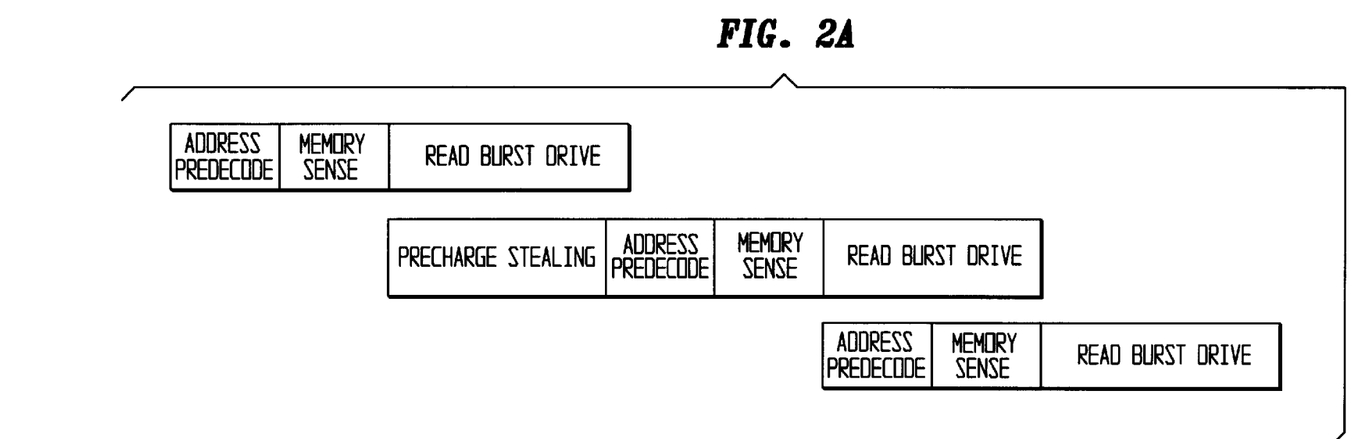
FIG. 2(A) discloses a Burst pipeline read operation of the invention.

As shown in FIG. 2(A), there are three consecutive cycles each of which is represented by one row timing chain. On the top row is the first memory burst read, on the middle row is the second memory burst read which is page-miss compared to the first one, and on the bottom row is the third memory burst read which is page-hit compared to the second one.

In the first cycle, the sequencer 25 sends out its control signals to the RAS buffer/decoder 21, the CAS buffer/decoder 23, the burst address counter 27, the page register/comparator 24, the data buffer 20, the register 29 and memory array 22, to perform in sequence the operations of the address predecode, the memory sense and the read burst drive. During the read burst drive of the first cycle, as long as the sequencer 25 detects a second burst read cycle (pending) and finds out a page-miss condition via output from the page register/comparator 24, the sequencer 25 instructs the HPPC DRAM to perform a precharge cycle concurrently with the read burst drive of the first cycle, so called precharge cycle stealing in the invention. When the precharge cycle of the second cycle is completed and in the last half period of the read burst drive of the first cycle, the sequencer 25 instructs to perform the address predecode operation. Thereafter, memory sense and read burst drive of the second cycle are in sequence performed. During the read burst drive of the second cycle, as long as the sequencer 25 detects a third burst read cycle (pending or queue) and finds out a page-hit condition via output from the page register/comparator 24, the sequencer 25, on one hand, skip the precharge cycle to the same page, and, on the other hand, instructs the HPPC DRAM to perform the address predecode operation directly. Thereafter, memory sense and read burst drive of the third cycle are in sequence performed.

The pipeline timing chain in the burst-read cycle shows that if there is a page-miss, overhead of the precharge cycle and address predecoding is eliminated while the HPPC DRAM is driving out the read data. The minimum wait state needs to be inserted is the address predecode plus memory cell sense time which is usually two clocks period. This apparently defeats a typical page-miss overhead of 11 clocks period of current DRAM architecture. If there is a page-hit, the address predecode and memory array sense operations are executed while the HPPC DRAM is driving out the burst read data. Therefore, when there is a page-hit, a zero wait state continuous burst transfer is sustained.

Figure 2B:
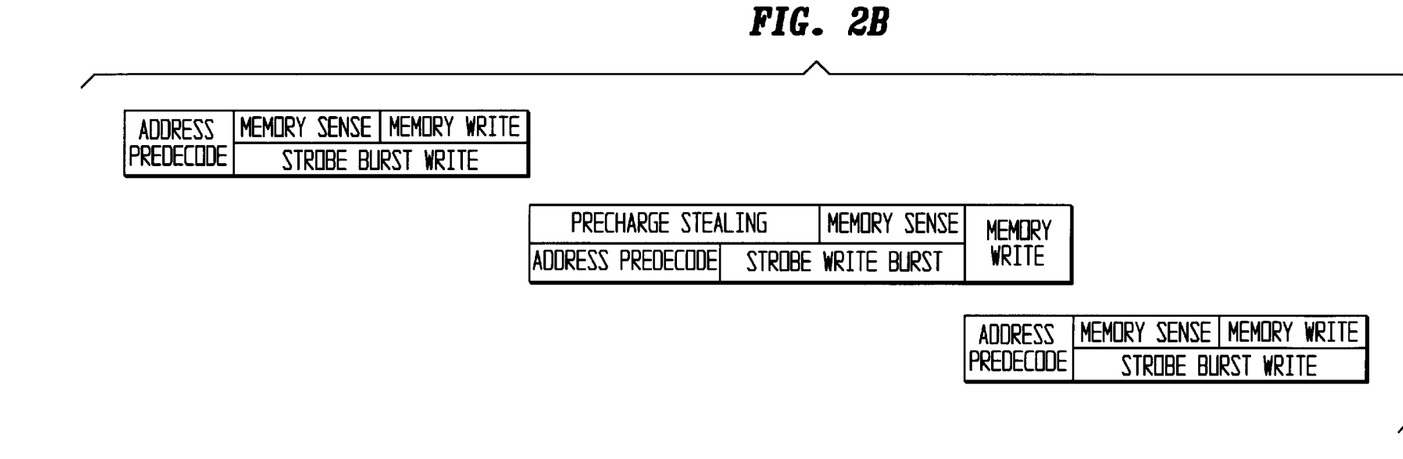
FIG. 2(B) discloses a Burst pipeline write operation of the invention.

As shown in FIG. 2(B), there are three consecutive cycles each of which is represented by one row timing chain. On the top row is the first memory burst write, on the middle row is the second memory burst write which is page-miss compared to the first one, and on the bottom row is the third memory burst write which is page-hit compared to the second one.

In the first cycle, the sequencer 25 sends out its control signals to the RAS buffer/decoder 21, the CAS buffer/decoder 23, the burst address counter 27, the page register/comparator 24, the data buffer 20, the register 29 and memory array 22, to perform the operations of the address predecode, the memory sense, the memory write and strobe write burst. It is to noted here, the operation of strobe write burst is first in parallel to the operation of the memory sense, and is secondly in parallel to the operation of the memory write. When the sequencer 25 detects a second burst write cycle and finds out a page-miss condition via output from the page register/comparator 24, the sequencer 25 instructs the HPPC DRAM to perform a precharge cycle, followed by a memory sense, concurrently with the address predecode, followed by a strobe write burst, of the second cycle. It is to be noted, in the second cycle (a page-miss) of FIG. 2, the precharge cycle operation is mainly concurrently to address predecode, and memory sense operation is mainly concurrently to the strobe write burst, although there might be a small time span during which the strobe write burst is operated concurrently with the precharge cycle as shown in the FIG. 2(B). The last partition of the second cycle is the memory write. During the memory write of the second cycle, as long as the sequencer 25 detects a third burst write cycle (pending) and finds out a page-hit condition via output from the page register/comparator 24, the sequencer 25, on one hand, skip the precharge cycle, and, on the other hand, instructs the HPPC DRAM to perform the address predecode operation directly. Thereafter, memory sense and memory write of the third cycle are in sequence performed. It is to be noted that the first half of the strobe write burst operation is performed concurrently to the memory sense, and the last half of the strobe write burst operation is performed concurrently to the memory write.

The pipeline timing chain in the burst-write cycle shows that if there is a page-miss, the HPPC DRAM strobes-in the external burst data stream while the precharge cycle and memory sense operations are being executed. The strobed-in data are temporarily stored in register 29. The sequencer 25 shifts the contents of the register 29 to the memory array 22 at the last strobed data, from which the memory-cell write begins. In such timing chain, a minimum wait state is the address predecode, typically one clock period. If there is a page-hit, the address predecode time is virtually eliminated due to its concurrent operation to the memory write of the last write cycle which results in a zero wait state.

The HPPC DRAM uses the above pipeline timing chain to achieve a high sustain bandwidth when either there is page-hit or page-miss. The wait state to be inserted, when needed, is comparable to the typical pipeline burst cache SRAM. Comparing with the true cache SRAM, the HPPC DRAM has the following advantages: 1) no requirement of cache TAG SRAM; 2) long wait state due to the cache-miss no long exists; 3) fewer memory hierarchy; 4) very cost effective compared to SRAM technology.

Figure 3:
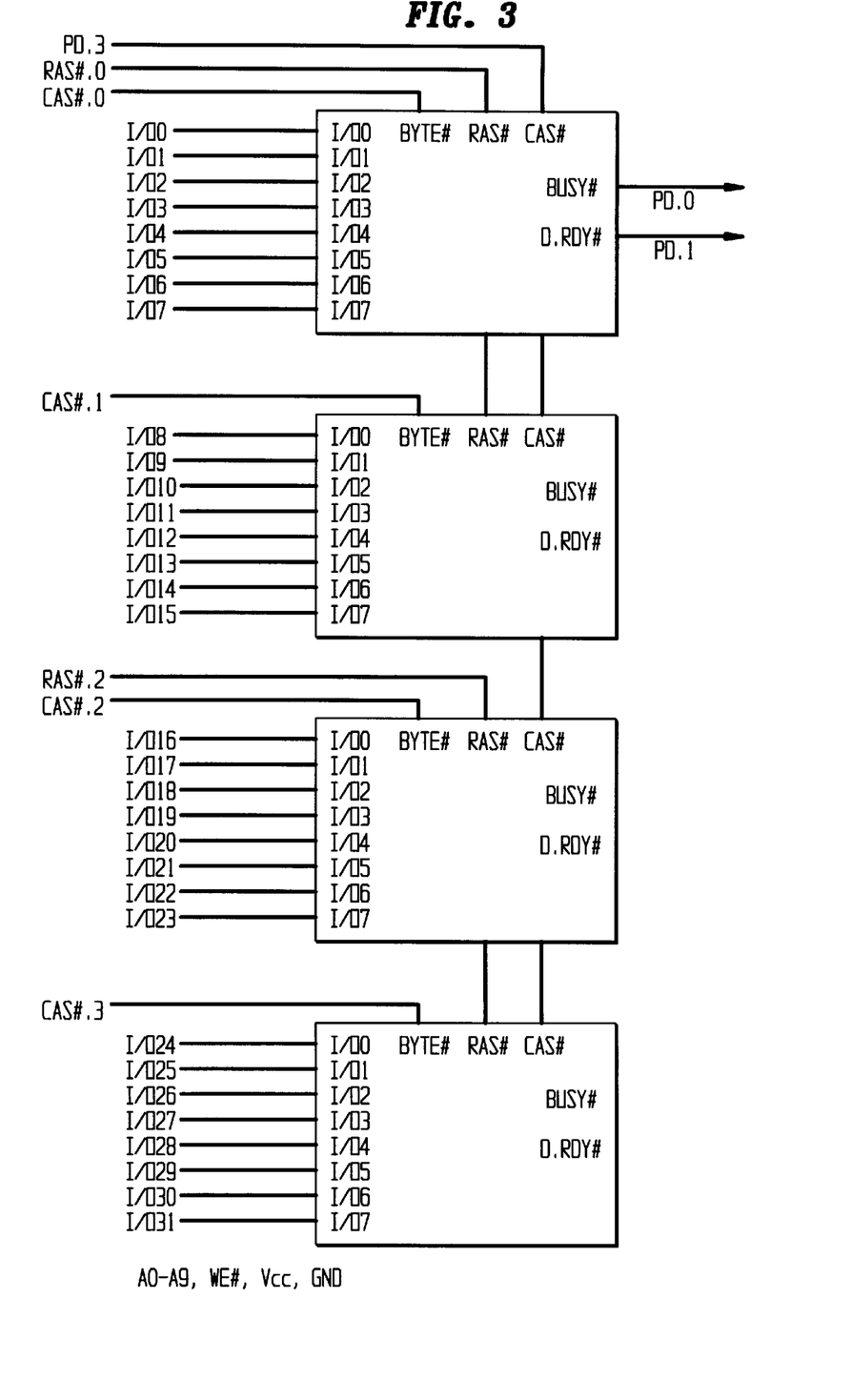
FIG. 3 shows a pin layouts of a DRAM SIMM made of the HPPC DRAM of the invention.

An external pin layouts of the HPPC DRAM of the invention and its associated DRAM SIMM is shown in FIG. 3. It can be seen this DRAM SIMM has 72 pins, of which 55 pins are electrical connection pins and others are power-supply pins and no connection (NC) pins, is backward-compatible to current fast-page-mode DRAM SIMM of the marketplace.

The external pin definitions of the HPPC DRAM are recited hereinafter.

(1) CAS# pin (Input)

CAS# is a pseudo clock which can be stopped at high. HPPC DRAM samples the RAS#, WE# and BYTE# at the falling edge of CAS#. All data and address driven by the memory controller will also be sampled at the falling edge of CAS#. The data driven out by HPPC DRAM will be substantially at the falling edge of CAS#. The memory controller should read in data at the falling edge of CAS#. CAS# should be synchronized with processor clock.

(2) RAS# pin (Input)

HPPC DRAM uses a two-clock period command packet to instruct the internal sequencer 25. RAS# is used to select the DRAM page in SIMM and start of command packet. If RAS# is sampled as low at the falling edge of CAS#, the internal sequencer 25 of HPPC DRAM will start a memory access sequence. RAS# can be pipelined by the memory controller. The memory controller is allowed to assert RAS# only after it samples a high BUSY#. The memory controller can not pipeline a write cycle after a read cycle. In this case, memory controller can start a rite cycle only after the last D_RDY# is strobed. This will allow one clock period of data bus turn-around cycle. HPPC DRAM can pipeline a read cycle after write cycle. With the availability of RAS# pipeline, a multiway interleave memory architecture can be easily achieved.

(3) WE# pin (Input)

The two-clock command packet is consisted of RAS# and WE signals. During this two-clock period, the combination of RAS# and WE# instructs HPPC DRAM to execute the following 6 active cycles.

TABLE 1

| 1st clock | | | 2nd clock | | | CYCLE |
|---|---|---|---|---|---|---|
| RAS#: | L | WE#: L | RAS#: | L | WE#: L | BURST WRITE |
| RAS#: | L | WE#: L | RAS#: | H | WE#: L | SINGLE WRITE |
| RAS#: | L | WE#: L | RAS#: | L | WE#: H | REGISTER WRITE |
| RAS#: | L | WE#: L | RAS#: | H | WE#: H | MEMORY REFRESH |
| RAS#: | L | WE#: H | RAS#: | L | WE#: H | BURST READ |
| RAS#: | L | WE#: H | RAS#: | H | WE#: H | SINGLE READ |
| RAS#: | L | WE#: H | RAS#: | H | WE#: L | MEMORY REFRESH |
| RAS#: | L | WE#: H | RAS#: | L | WE#: L | REGISTER READ |

(4) BYTE# pin (Input)

BYTE# is used to enable the byte-transfer operation in each DRAM chip in SIMM. During the read cycle, BYTE# is ignored, HPPC DRAM will always drive all byte data to the bus. The memory controller is responsible for strobing the desired data. HPPC DRAM may also implements an unique feature to support partial memory line flush. The memory controller can issue a burst write cycle and every burst cycle can have a different state of BYTE# signal. The BYTE# is strobed along with data. Thus in the write cycle, the BYTE# needs to be valid along with data at each clock period.

(5) BUSY# pin (Output)

BUSY# is a protocol to allow HPPC DRAM to do pipeline access. The selected memory DRAM chip in SIMM will assert BUSY# to low after decoding command packet and de-assert BUSY# to high after the internal sequencer 25 completes the memory access instruction. However, since it is well known that how to design a memory controller to render all memory chips within the DRAM SIMM have same status, single BUSY# output from any one of the HPPC DRAM chips could be used to form SIMM output signal PD_0. When BUSY is de-asserted, the internal sequencer 25 will be ready to accept the next command packet. The HPPC DRAM memory controller needs to monitor BUSY# and asserts the pending RAS# at the next clock after sampling a high BUSY#. BUSY# is an open drain driver allowing wired-OR connection.

(6) D_RDY# pin (Output)

D_RDY# is asserted by the selected DRAM chip in SIMM However, since it is well known that how to design a memory controller to render all memory chips within the DRAM SIMM have same status, single D_RDY# output from any one of the HPPC DRAM chips could be used to form SIMM output signal PD_1. For the write cycle, HPPC DRAM will not assert D_RDY#. It would be the responsibility of the memory controller to toggle the bursted data after the second clock (T2). When HPPC DRAM decodes the current cycle as the burst write cycle, the HPPC DRAM will strobe in the four consecutive byte-data in the next four cycles after the first clock (T1). For the read cycle, the HPPC DRAM asserts the D_RDY# when the data is ready for the memory controller to read. The DRAM controller should strobe the data at the falling edge of the CAS# if D_RDY# is low. D_RDY# is an open drain driver allowing wired-OR connection. The memory controller can OR the BUSY# and D_RDY# inside the memory controller chip.

(7) A9–A0 pins (Input)

A9–A0 are address inputs. All address inputs are multiplexed between row address and column address. For every DRAM cycle, the first command clock period is the row address and the second command clock period is the column address. The address is strobed at the falling edge of CAS#. The memory controller should synchronize the new address with the CAS# clock period.

(8) D7–D0 pins (Input/Output)

D7–D0 are data input/output. The HPPC DRAM will add a turn-around cycle for write cycle after read cycle. This is to solve the possible data bus contention. When the memory controller samples a low D_RDY# at the falling edge of CAS#, it needs to read in D7–D0. Write cycle can be started only after the last D_RDY# is sampled. This will insert a turn-around clock to the data bus. HPPC DRAM always assume the zero wait in read and write cycle. It is the responsibility of the memory controller to meet zero wait state operation.

It is to be noted, to person skilled in the arts, the functions of the aforesaid signals may still be achieved by replacing the asserted logic low or high state by an asserted high or low state, and vice versa. Those modifications and substitutions are still within the spirits of the invention.

As shown in FIG. 3 and above detailed recitation, HPPC DRAM uses three extra protocols compared to the fast page mode DRAM. These three protocols, namely byte select (BYTE#), memory_busy(BUSY#) and data_ready(D_RDY#), are used to support pipeline request from the memory controller. Any three of the identity pins, i.e. PRD1, PRD2, PRD3 and PRD4 pins of the conventional fast page mode DRAM SIMM, will be used to support the HPPC DRAM extra protocols. Based on the above recitations of HPPC DRAM and the external pins definition, the memory controller capable of supporting both HPPC DRAM of the invention and the conventional fast page mode DRAM is readily designed.

In summary, HPPC DRAM of the invention includes intelligent peripheral circuits to perform the following functions: 1) external pipeline request queuing, 2) hidden precharge cycle stealing, 3) internal cycle regulating, 4) packet command decoding, 5) page-hit comparison, 6) burst access address generation, 7) external DRAM controller handshaking.

Figure 4:
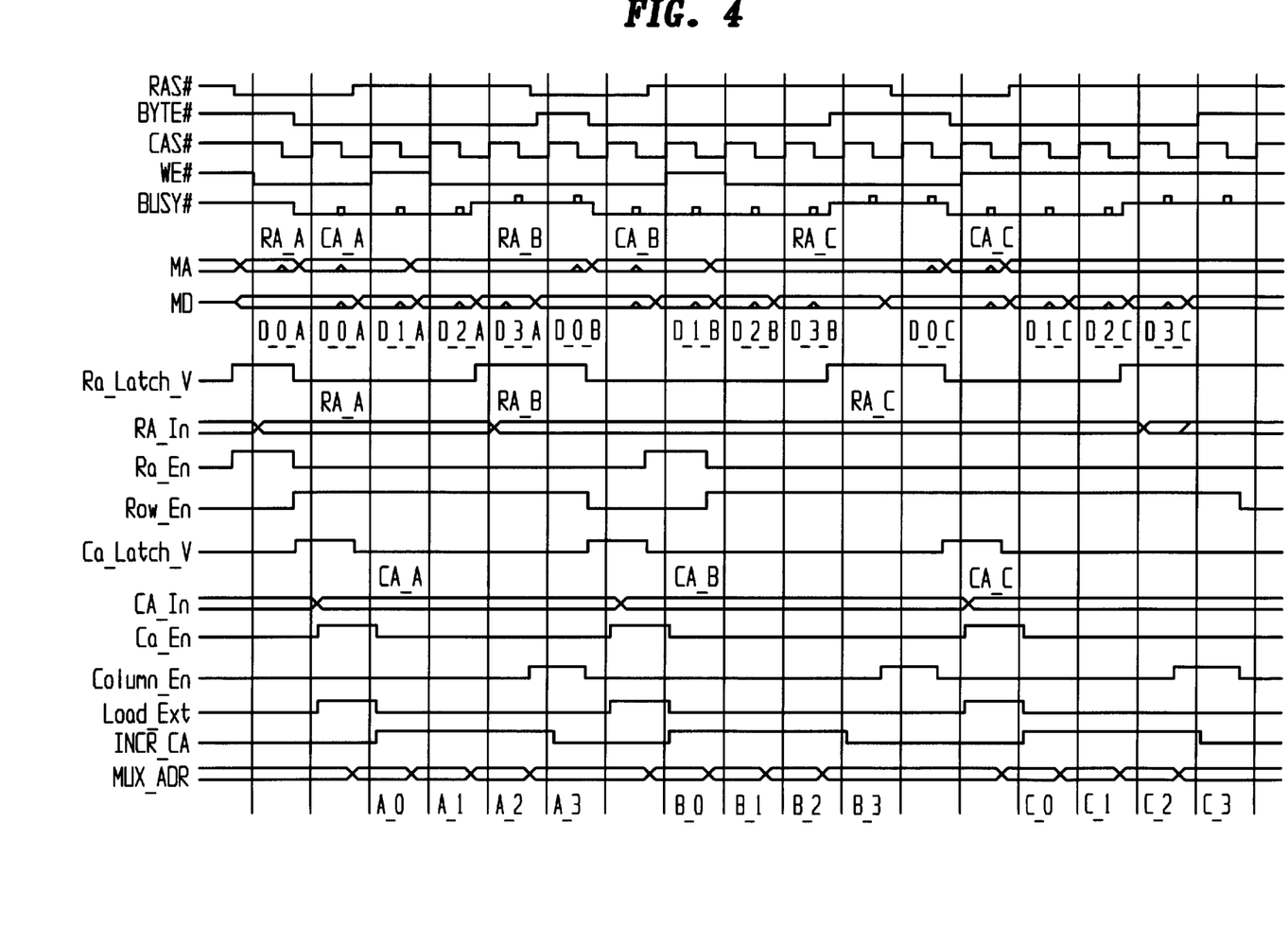
FIG. 4 shows a detailed timing of the associated signals of the invention going through the following states: Idle→Burst write→Queue burst write (page-miss)→Queue burst write (page-hit).
Figure 5:
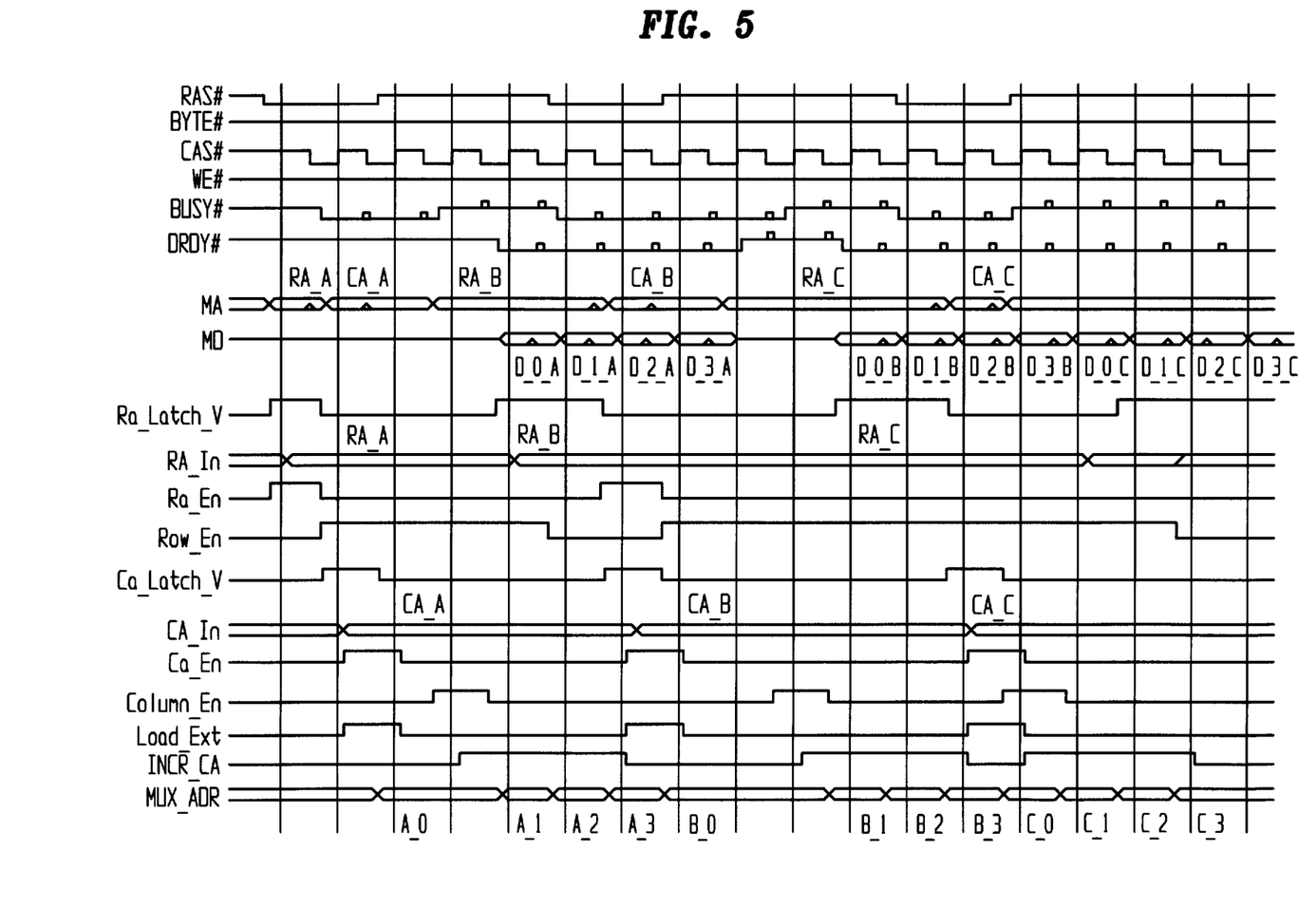
FIG. 5 shows a detailed timing of the associated signals of the invention going through the following states: Idle→Burst read→Queue burst read (page-miss)→Queue burst read (page-hit).

The above detailed descriptions of the invention may be summarized by the detailed timing diagrams of FIG. 4 and FIG. 5.

In FIG. 4, there is disclosed an timing diagram of the associated signals of the invention which goes through the following status, that is: Idle→Burst write→Queue burst write (page-miss)→Queue burst write (page-hit). In FIG. 4, the RA_IN signal represents the value within the row address buffer/decoder 21, the MUX_ADR is the signal output from the burst address counter 27, MA is the external address and MD is signal of data input/output line.

In FIG. 5, there is disclosed an timing diagram of the associated signals of the invention which goes through the following status, that is: Idle→Burst read→Queue burst read (page-miss)→Queue burst read (page-hit). In FIG. 5, the CA_IN signal represents the value within the column address buffer/decoder 23, the MUX_ADR is the signal output from the burst address counter 27, MA is the external address and MD is signal of data input/output line.

I claim:

1. A single integrated circuit DRAM device, the DRAM device configured to perform an address predecode operation, a memory sense operation, and a read drive operation in response to a read memory cycle, the DRAM device comprising:
   a memory cell array;
   a sense amplifier coupled to the memory cell array;
   a register configured to hold data output from the sense amplifier; and
   an on-chip state machine means configured to execute the read drive operation of an on-going memory cycle concurrent with a precharge operation of a pending memory cycle by asserting a first control signal to the register and by asserting a second control signal to the memory cell array, and configured to generate a signal indicating the status of the DRAM device to a controller external to the DRAM device.

2. The DRAM device as recited in claim 1, wherein the on-chip state machine means is configured to execute the read drive operation of the on-going memory cycle concurrent with the memory sense operation of the pending memory cycle by further asserting a third control signal to the sense amplifier.

3. The DRAM device as recited in claim 1, wherein the address predecode operation is a first address predecode operation, the memory sense operation is a first memory sense operation, and the DRAM device is configured to perform a second address predecode operation, a second memory sense operation, a memory write operation and a write strobe operation in response to a write memory cycle, the DRAM device further comprising:
   a data buffer configured to receive and store data from the write memory cycle;
   the register is connected to the data buffer through an internal data bus, wherein the register is configured to store data on the internal data bus when the register is activated;
   the sense amplifier is coupled to the register; and
   the on-chip state machine means is configured to execute the second memory sense operation of an on-going write memory cycle concurrent with the write strobe operation of the on-going write memory cycle by asserting a third control signal to activate the sense amplifier and by asserting a fourth control signal to activate the register.

4. The DRAM device as recited in claim 1, wherein the address predecode operation is a first address predecode operation, the memory sense operation is a first memory sense operation, and the DRAM device is configured to perform a second address predecode operation, a second memory sense operation, a memory write operation and a write strobe operation in response to a write memory cycle, the DRAM device further comprising:
   a data buffer configured to receive and store data from the write memory cycle;
   the register is connected to the data buffer through an internal data bus, wherein the register is configured to store data on the internal data bus when the register is activated;
   the sense amplifier is further coupled to the register; and
   the on-chip state machine means is configured to execute the memory write operation of an on-going write memory cycle concurrent with the write strobe operation of the on-going write memory cycle by asserting a third control signal to activate the sense amplifier and by asserting a fourth control signal to activate the register.

5. The DRAM device as recited in claim 1, wherein the address predecode operation is a first address predecode operation, the memory sense operation is a first memory sense operation, and the DRAM device is configured to perform a second address predecode operation, a second memory sense operation, a memory write operation and a write strobe operation in response to a write memory cycle, the DRAM device further comprising:

an address buffer/decoder configured to receive an external address signal for decoding the memory location of the write memory cycle; and the on-chip state machine means is configured to execute the precharge operation of an on-going write memory cycle concurrent with the address predecode operation of the on-going write memory cycle by asserting a third control signal to the memory cell array and by asserting a fourth control signal to the address buffer/decoder.

6. The DRAM device as recited in claim 1, the DRAM device further comprising:

an on-chip page register/comparator configured to indicate a page-hit or a page-miss condition between a first memory cycle and a second memory cycle; and the memory cell array is configured to be precharged in response to the page-miss condition.

7. A single integrated circuit DRAM device, the DRAM device configured to perform an address predecode operation, a memory sense operation, and a read drive operation in response to a read memory cycle, the DRAM device comprising:

a memory cell array;

a sense amplifier coupled to the memory cell array;

a register configured to hold data output from the sense amplifier;

an address buffer/decoder configured to receive an external address signal for decoding a memory location of the read memory cycle; and an on-chip state machine means configured to execute the read drive operation of an on-going memory cycle concurrent with the address predecode operation of a pending memory cycle by asserting a first control signal to the register and by asserting a second control signal to the address buffer/decoder, and configured to generate a signal indicating the status of the DRAM device to a controller external to the DRAM device.

8. The DRAM device as recited in claim 7, wherein the on-chip state machine means is configured to execute the read drive of the on-going memory cycle concurrent with the memory sense operation of the pending memory cycle by further asserting a third control signal to the sense amplifier.

9. The DRAM device as recited in claim 7, wherein the address predecode operation is a first address predecode operation, the memory sense operation is a first memory sense operation, and the DRAM device is configured to perform a second address predecode operation, a second memory sense operation, a memory write operation and a write strobe operation in response to a write memory cycle, the DRAM device further comprising:

a data buffer configured to receive and store data from the write memory cycle;

the register is connected to the data buffer through an internal data bus, wherein the register is configured to store the data on the internal data bus when the register is activated;

the sense amplifier is further coupled to the register; and the on-chip state machine means is configured to execute the second memory sense operation of an on-going write memory cycle concurrent with the write strobe operation of the on-going write memory cycle by asserting a third control signal to the sense amplifier and by asserting a fourth control signal to activate the register.

10. The DRAM device as recited in claim 7, wherein the address predecode operation is a first address predecode operation, the memory sense operation is a first memory sense operation, and the DRAM device is configured to perform a second address predecode operation, a second memory sense operation, a memory write operation and a write strobe operation in response to a write memory cycle, the DRAM device further comprising:

a data buffer configured to receive and store data from the write memory cycle;

the register is connected to the data buffer through an internal data bus, wherein the register is configured to store the data on the internal data bus when the register is activated;

the sense amplifier is coupled to the register; and the on-chip state machine means is configured to execute the memory write operation of an on-going write memory cycle concurrent with the write strobe operation of the on-going write memory cycle by asserting a third control signal to activate the sense amplifier and by asserting a fourth control signal to activate the register.

11. The DRAM device as recited in claim 7, wherein the address predecode operation is a first address predecode operation, the memory sense operation is a first memory sense operation, and the DRAM device is configured to perform a second address predecode operation, a second memory sense operation, a memory write operation and a write strobe operation in response to a write memory cycle, the DRAM device further comprising:

the address buffer/decoder configured to decode a memory location of the write memory cycle; and the on-chip state machine means is configured to execute the precharge operation of an on-going write memory cycle concurrent with the address predecode operation of the on-going write memory cycle by asserting a third control signal to the memory cell array and by asserting a fourth control signal to the address buffer/decoder.

12. The DRAM device as recited in claim 7, the DRAM device further comprising:

an on-chip page register/comparator configured to indicate a page-hit or a page-miss condition between a first memory cycle and a second memory cycle; and the memory cell array is configured to be precharged in response to the page-miss condition.

13. A single integrated circuit DRAM device, the DRAM device configured to perform an address predecode operation, a memory sense operation, and a read drive operation in response to a read memory cycle, the DRAM device comprising:

a memory cell array;

a sense amplifier coupled to the memory cell array;

a register configured to hold data output from the sense amplifier; and an on-chip state machine means configured to execute the read drive operation of an on-going memory cycle concurrent with the memory sense operation of a pending memory cycle by asserting a first control signal to the register and by asserting a second control signal to the sense amplifier, and configured to generate a signal indicating the status of the DRAM device to a controller external to the DRAM device.

14. The DRAM device as recited in claim 13, wherein the address predecode operation is a first address predecode operation, the memory sense operation is a first memory sense operation, and the DRAM device is configured to perform a second address predecode operation, a second memory sense operation, a memory write operation and a write strobe operation in response to a write memory cycle, the DRAM device further comprising:

a data buffer configured to receive and store data from the write memory cycle;

the register is connected to the data buffer through an internal data bus, wherein the register is configured to store data on the internal data bus when the register is activated;

the sense amplifier is coupled to the register; and the on-chip state machine means is configured to execute the second memory sense operation of an on-going write memory cycle concurrent with the write strobe operation of the on-going write memory cycle by asserting a third control signal to the sense amplifier and by asserting a fourth control signal to activate the register.

15. The DRAM device as recited in claim 13, wherein the address predecode operation is a first address predecode operation, the memory sense operation is a first memory sense operation, and the DRAM device is configured to perform a second address predecode operation, a second memory sense operation, a memory write operation and a write strobe operation in response to a write memory cycle, the DRAM device further comprising:

a data buffer configured to receive and store data from the write memory cycle;

the register is connected to the data buffer through an internal data bus, wherein the register is configured to store data on the internal data bus when the register is activated;

the sense amplifier is coupled to the register; and the on-chip state machine means is configured to execute the memory write operation of an on-going write memory cycle concurrent with the write strobe operation of the on-going write memory cycle by asserting a third control signal to activate the sense amplifier and by asserting a fourth control signal to activate the register.

16. The DRAM device as recited in claim 13, wherein the address predecode operation is a first address predecode operation, the memory sense operation is a first memory sense operation, and the DRAM device is configured to perform a second address predecode operation, a second memory sense operation, a memory write operation and a write strobe operation in response to a write memory cycle, the DRAM device further comprising:

an address buffer/decoder configured to receive an external address signal for decoding a memory location of the write memory cycle; and the on-chip state machine means is configured to execute the precharge operation of an on-going write memory cycle concurrent with the address predecode operation of the on-going write memory cycle by asserting a third control signal to the memory cell array and by asserting a fourth control signal to the address buffer/decoder.

17. The DRAM device as recited in claim 13, wherein the address predecode operation is a first address predecode operation, the memory sense operation is a first memory sense operation, and the DRAM device is configured to perform a second address predecode operation, a second memory sense operation, a memory write operation and a write strobe operation in response to a write memory cycle, the DRAM device further comprising:

an address buffer/decoder configured to receive an external address signal for decoding a memory location of the write memory cycle;

a data buffer configured to receive and store data from the write memory cycle;

the sense amplifier is coupled to the register; and the on-chip state machine means is configured to execute the memory write operation of an on-going write memory cycle concurrent with the address predecode operation of a pending write memory cycle by asserting a third control signal to activate the sense amplifier and by asserting a fourth control signal to the address buffer/decoder.

18. The DRAM device as recited in claim 13, the DRAM device further comprising:

an on-chip page register/comparator configured to indicate a page-hit or a page-miss condition between a first memory cycle and a second memory cycle; and the memory cell array is configured to be precharged in response to the page-miss condition.

19. A single integrated circuit DRAM device, the DRAM device configured to perform an address predecode operation, a memory sense operation, a memory write operation and a write strobe operation in response to a write memory cycle, the DRAM device comprising:

a data buffer configured to receive and store data from the write memory cycle;

a register connected to the data buffer through an internal data bus, wherein the register is configured to store data on the internal data bus when the register is activated;

a memory cell array;

a sense amplifier coupled to the memory cell array and the register; and an on-chip state machine means configured to execute the memory sense operation of an on-going memory cycle concurrent with the write strobe operation of the on-going memory cycle by asserting a first control signal to the sense amplifier and by asserting a second control signal to activate the register, and configured to generate a signal indicating the status of the DRAM device to a controller external to the DRAM device.

20. The DRAM device as recited in claim 19, wherein the on-chip state machine means is configured to execute the memory write operation of an on-going memory cycle concurrent with the write strobe operation of the on-going memory cycle by asserting a third control signal to activate the sense amplifier and by asserting a fourth control signal to activate the register.

21. The DRAM device as recited in claim 19, the DRAM device further comprising:

an address buffer/decoder configured to receive an external address signal for decoding a memory location of the write memory cycle; and the on-chip state machine means is configured to execute the precharge operation of an on-going write memory cycle concurrent with the address predecode operation of the on-going write memory cycle by asserting a third control signal to the memory cell array and by asserting a fourth control signal to the address buffer/decoder.

22. The DRAM device as recited in claim 19, the DRAM device further comprising:

an address buffer/decoder configured to receive an external address signal for decoding a memory location of the write memory cycle; and the on-chip state machine means is configured to execute the memory write operation of an on-going write memory cycle concurrent with the address predecode operation of a pending write memory cycle by asserting a third control signal to activate the sense amplifier and by asserting a fourth control signal to the address buffer/decoder.

23. The DRAM device as recited in claim 19, the DRAM device further comprising:

an on-chip page register/comparator configured to indicate a page-hit or a page-miss condition between a first memory cycle and a second memory cycle; and the memory cell array is configured to be precharged in response to the page-miss condition.

24. A single integrated circuit DRAM device, the DRAM device configured to perform an address predecode operation, a memory sense operation, a memory write operation and a write strobe operation in response to a write memory cycle, the DRAM device comprising:

a data buffer configured to receive and store data from the write memory cycle;

a register connected to the data buffer through an internal data bus, wherein the register is configured to store data on the internal data bus when the register is activated;

a memory cell array;

a sense amplifier coupled to the memory cell array and the register; and an on-chip state machine means configured to execute a memory write operation of an on-going memory cycle concurrent with the write strobe operation of the on-going memory cycle by asserting a first control signal to activate the sense amplifier and by asserting a second control signal to activate the register, and configured to generate a signal indicating the status of the DRAM device to a controller external to the DRAM device.

25. The DRAM device as recited in claim 24, the DRAM device further comprising:

a data buffer/decoder configured to receive an external address signal for decoding a memory location from the write memory cycle; and the on-chip state machine means is configured to execute the precharge operation of an on-going write memory cycle concurrent with the address predecode operation of the on-going write memory cycle by asserting a third control signal to the memory cell array an by asserting a fourth control signal the address buffer/decoder.

26. The DRAM device as recited in claim 24, the DRAM device further comprising:

an address buffer/decoder configured to receive an external address signal for decoding a memory location from the write memory cycle; and the on-chip state machine means is configured to execute the memory write operation of an on-going write memory cycle concurrent with the address predecode operation of a pending write memory cycle by further asserting a third control signal to the address buffer/decoder.

27. The DRAM device as recited in claim 24 the DRAM device further comprising:

an on-chip page register/comparator configured to indicate a page-hit or a page-miss condition between a first memory cycle and a second memory cycle; and the memory cell array is configured to be precharged in response to the page-miss condition.

28. A single integrated circuit DRAM device, the DRAM device configured to perform an address predecode operation, a memory sense operation, a memory write operation and a write strobe operation in response to a write memory cycle, the DRAM device comprising:

a memory cell array;

an address buffer/decoder configured to receive an external address signal for decoding a memory location of the write memory cycle; and an on-chip state machine means configured to execute a precharge operation of an on-going memory cycle concurrent with the address predecode operation of the on-going memory cycle by asserting a first control signal to the memory cell array and by asserting a second control signal to the address buffer/decoder, and configured to generate a signal indicating the status of the DRAM device to a controller external to the DRAM device.

29. The DRAM device as recited in claim 28, the DRAM device further comprising:

a data buffer configured to receive and store data from the write memory cycle;

a register connected to the data buffer through an internal bus, wherein the register is configured to store data on the internal data bus when the register is activated;

a sense amplifier coupled to the memory cell array and the register; and the on-chip state machine means is configured to execute the memory write operation of an on-going write memory cycle concurrent with the address predecode operation of a pending write memory cycle by asserting a third control signal to activate the sense amplifier and by asserting a fourth control signal to the address buffer/decoder.

30. The DRAM device as recited in claim 28, the DRAM device further comprising:

an on-chip page register/comparator configured to indicate a page-hit or a page-miss condition between a first memory cycle and a second memory cycle; and the memory cell array is configured to be precharged in response to the page-miss condition.

31. A single integrated circuit DRAM device, the DRAM device configured to perform an address predecode operation, a memory sense operation, a memory write operation and write strobe operation in response to a write memory cycle, the DRAM device comprising:

an address buffer/decoder configured to receive an external address signal for decoding a memory location of the write memory cycle;

a data buffer configured to receive and store data from the write memory cycle;

a register connected to the data buffer through an internal bus, wherein the register is configured to store data on the internal data bus when the register is activated;

a memory cell array;

a sense amplifier coupled to the memory cell array and the register; and an on-chip state machine means configured to execute the memory write operation of an on-going memory cycle concurrent with the address predecode operation of a pending memory cycle by asserting a first control signal to activate the sense amplifier and by asserting a second control signal to the address buffer/decoder, and configured to generate a signal indicating the status of the DRAM device to a controller external to the DRAM device.

32. The DRAM device as recited in claim 31, the DRAM device further comprising:

an on-chip page register/comparator configured to indicate a page-hit or a page-miss condition between a first memory cycle and a second memory cycle; and the memory cell array is configured to be precharged in response to the page-miss condition.

* * * * *